United States Patent [19]

Klose et al.

[11] Patent Number: 5,498,567
[45] Date of Patent: Mar. 12, 1996

[54] METHOD FOR MANUFACTURING A LATERALLY LIMITED, SINGLE-CRYSTAL REGION ON A SUBSTRATE AND THE EMPLOYMENT THEREOF FOR THE MANUFACTURE OF AN MOS TRANSISTOR AND A BIPOLAR TRANSISTOR

[75] Inventors: Helmut Klose, Munich; Thomas Meister, TAufkirchen; Hans-Willi Meul, Bruckmuehl; Reinhard Stengl, Stadtbergen, all of Germany

[73] Assignee: Siemens Aktiengesellschaft, Munich, Germany

[21] Appl. No.: 379,861

[22] Filed: Apr. 3, 1995

Related U.S. Application Data

[62] Division of Ser. No. 185,514, Jan. 24, 1994, Pat. No. 5,422,303, which is a division of Ser. No. 950,068, Sep. 23, 1992, Pat. No. 5,326,718.

[30] Foreign Application Priority Data

Sep. 23, 1991 [DE] Germany ............ 41 31 619.3

[51] Int. Cl.⁶ .................................................. H01L 21/20
[52] U.S. Cl. .............................. 437/89; 437/90; 437/40; 437/41; 437/228
[58] Field of Search ............................. 437/89, 90, 91, 437/92, 228 SE, 228 SD, 228 CR, 40 R, 41 R, 29, 913

[56] References Cited

U.S. PATENT DOCUMENTS

| | | | |
|---|---|---|---|
| 4,529,455 | 7/1985 | Bean et al. | 148/DIG. 25 |
| 4,614,564 | 9/1986 | Sheldon et al. | 437/90 |
| 4,757,029 | 7/1988 | Koury, Jr. | 437/90 |
| 4,892,837 | 1/1990 | Kudo | 437/31 |
| 4,966,861 | 10/1990 | Mieno et al. | 437/90 |
| 4,999,314 | 3/1991 | Pribat et al. | 437/89 |
| 5,028,557 | 7/1991 | Tsai et al. | 437/59 |
| 5,296,087 | 3/1994 | Tokunaga | 437/89 |
| 5,393,681 | 2/1995 | Witek et al. | 437/90 |

FOREIGN PATENT DOCUMENTS

| | | |
|---|---|---|
| 0042698 | 12/1981 | European Pat. Off. . |
| 0418422A1 | 9/1989 | European Pat. Off. . |
| 0430279 | 6/1991 | European Pat. Off. . |
| 3825701 | 10/1987 | Germany . |

OTHER PUBLICATIONS

F. Sato, et al., International Electron Devices Meeting, 1990, San Francisco, California; Dec. 9, 1990, pp. 607–610.

Peter J. Schubert, et al., "Vertical Bipolar Transistors Fabricated in Local Silicon on Insulator Films Prepared Using Confined Lateral Selective Epitaxial Growth (CLSEG)", IEEE Transactions on Electron Devices, vol. 37, No. 11, Nov. 1990, pp. 2336–2342.

S. M. Sze VLSI Technology, 2d Ed. McGraw–Hill, 1988, p. 79.

H. Goto, Springer Series in Electronics and Photonics, "Ultra–Fast Silicon Bipolar Technology", vol. 27, pp. 61–77.

Primary Examiner—Tuan H. Nguyen
Attorney, Agent, or Firm—Hill, Steadman & Simpson

[57] ABSTRACT

A method for the manufacture of a laterally limited single crystal region that is suitable for use as an active part of a transistor, including the steps of: a) providing a substrate made of a single crystal semiconductor material; b) forming a first layer on a surface of the substrate, said first layer being selectively etchable with respect to the substrate; c) forming a second layer on the first layer, the second layer being selectively etchable with respect to the first layer; d) providing an opening in the first and second layers so as to expose an area on the surface of the substrate; e) selectively etching the first layer with respect to the substrate and the second layer so as to provide an undercut between the second layer and the surface of the substrate; f) forming a single crystal region on the exposed surface of the substrate by selective epitaxy: g) doping the second layer such that parts of the second layer adjoining the single-crystal region acting as a channel region form a source region and a drain region; h) producing a gate dielectric at a surface of the single-crystal region; and i) forming a gate electrode that is insulated from the source and drain regions on the gate dielectric.

7 Claims, 7 Drawing Sheets

METHOD FOR MANUFACTURING A LATERALLY LIMITED, SINGLE-CRYSTAL REGION ON A SUBSTRATE AND THE EMPLOYMENT THEREOF FOR THE MANUFACTURE OF AN MOS TRANSISTOR AND A BIPOLAR TRANSISTOR

This is a division of application Ser. No. 08/185,514, filed Jan. 24, 1994, now U.S. Pat. No. 5,422,303, which is a division of application Ser. No. 07/950,068 filed Sep. 23, 1992 which issued on Jul. 15, 1994 as U.S. Pat. No. 5,326,718.

BACKGROUND OF THE INVENTION

The present invention generally relates to the manufacture of integrated electronics. More specifically, the invention relates to methods for laterally limiting single crystal regions in substrates.

Laterally limited, single-crystal regions that are produced by selective epitaxy at the surface of a substrate within limiting structures are increasingly employed in semiconductor technology. For example, European patent EP 0 418 422 A1 discloses a bipolar transistor whose collector is manufactured by selective epitaxy within a region on the surface of a substrate limited by oxide structures. However, high demands must be made of the crystal quality upon employment of such a single-crystal region produced by selective epitaxy as active part of a transistor.

In selective epitaxy on a substrate of, for example, silicon within a limiting structure of, for example, silicon oxide, the deposition conditions for the silicon are set such that only the silicon grows on silicon surfaces. Since the silicon grows only according to the orientation of the surface of the substrate, a single-crystal region thereby arises within the limiting structure. It has been observed, however, that the single-crystal region has crystal defects in the parts or portions thereof neighboring the limiting structure.

When using a single-crystal region produced by selective epitaxy as an active part of a transistor, for example as base, it is also desirable to laterally connect the single-crystal region via a correspondingly doped polycrystalline silicon layer. It would therefore be desirable to grow the single-crystal region within a limiting structure on polysilicon. The problem arises, however, that silicon grows not only on the single-crystal surface of the substrate but also on the exposed surfaces of the polycrystalline silicon layer. Since the surface of the polycrystalline silicon layer does not have a uniform crystal orientation, grain limits therefore arise in that part of the single-crystal region growing on the polysilicon to such an extent that these parts can no longer be referred to as single-crystal. Such a selectively grown silicon region can no longer satisfy the demands made of the crystal quality for an active part of a transistor.

SUMMARY OF THE INVENTION

The invention provides a method for manufacturing a laterally limited, single-crystal region on a substrate, whereby the single-crystal region can be utilized as active part of a transistor. In particular, the method should be suitable for manufacturing a single-crystal region that is laterally contacted by a correspondingly doped polycrystalline layer.

In an embodiment, the invention provides a method for manufacturing a laterally limited, single crystal region on a substrate, comprising the steps of:

a) forming a first layer on a surface of the substrate of a single crystal semiconductor material, said first layer being selectively etchable with respect to the substrate;

b) forming a second layer on the first layer, the second layer being selectively etchable with respect to the first layer;

c) providing an opening in the first and second layers so as to expose an area on the surface of the substrate;

d) selectively etching the first layer with respect to the substrate and the second layer so as to provide an undercut between the second layer and the surface of the substrate; and e) forming a single crystal region on the exposed surface of the substrate by selective epitaxy.

An advantage of the foregoing method is that the single-crystal region thereby grows on the surface of the substrate that is laterally limited by the structured, first layer. Since the first layer comprises an under-etching or undercut under the second layer, those parts of the single-crystal region wherein crystal defects or grain boundaries arise lie under the edges of the second layer. The single-crystal region manufactured in this way is essentially free of crystal defects within the structured, second layer and meets the demands for employment as active part of a transistor.

It lies within the scope of the invention to dope the single-crystal region in situ by adding compounds containing dopant in the selective epitaxy. This has the advantage that the single-crystal region can be manufactured with a dopant profile proceeding perpendicularly with respect to the surface of the substrate. In particular, it is possible to dope the single-crystal region at the surface with one conductivity type and to provide a thin layer of the opposite conductivity type therebelow. This possibility can be employed for manufacturing a MOS transistor having what is referred to as a Delta-shaped, doped channel region.

A substrate preferably is made of silicon. The single-crystal region is usually produced thereon from the same semiconductor material, i.e. likewise of silicon. However, it is also possible to add another semiconductor material, for example germanium, to the single-crystal region, so that the single-crystal region is composed of $Si_{1-x}Ge_x$, where x lies between 0.2 and 0.4. The method can then be suitable for manufacturing hetero components.

It also is within the scope of the invention to construct the first layer of $SiO_2$ and the second layer of polycrystalline silicon. In this case, the surfaces and the side walls of the second layer of polycrystalline silicon preferably are covered with a third layer before producing the undercuts or underetchings, no nucleation occurring at the surface of this third layer in the selective epitaxy, and this third layer resisting the etchings of the second layer and of the first layer. $Si_3N_4$ is particularly suited for this purpose. The third layer of $Si_3N_4$, can remain on the second layer of polycrystalline silicon after the selective epitaxy. However, it is advantageous to remove the third layer to avoid any deformation in the finished component.

By doping the second layer of polycrystalline silicon, the second layer becomes employable as a terminal for the single-crystal region. In this way, a self-aligned or self-registering terminal to the single-crystal region is formed.

A method of the invention also is suitable for employment in the manufacture of a MOS transistor. In this case, the second layer preferably is formed of polycrystalline silicon and the single-crystal region acts as channel region. The second layer then is doped such that a source and a drain region are formed at regions of the second layer adjacent to the channel region. A gate dielectric then is produced at the surface of the single-crystal region. A gate electrode that is insulated from source and drain region is formed on the gate dielectric.

In this manufacturing method for a MOS transistor, source and drain regions are arranged self-aligned with respect to the channel region. The gate electrode can in turn be arranged self-aligned or self-registering between source and drain region by employing a spacer technique. A planar MOS transistor can be manufactured with a suitable selection of the layer thicknesses of the first layer and of the second layer, as well as of the gate electrode.

By adding a corresponding dopant in the manufacture of the single-crystal region, the channel region can be provided with a vertical dopant profile. In particular, the manufacture of a Delta-doped layer is possible. A Delta-doped layer is employed as a substitute for an anti-punch implantation in MOS transistors. A Delta-doped layer has a thickness of, for example, 20 nm. Such a layer is doped opposite the conductivity type of the source and drain region and it is arranged under the region of the channel region wherein the channel forms in the finished transistor.

A method of the invention for manufacturing a single-crystal region also is suitable for the manufacture of a bipolar transistor. In this case, a collector preferably is formed in the substrate under the single-crystal region. A base then is formed in the single-crystal region. For example, the single-crystal region can form the base itself.

Another possibility is that the single-crystal region can represent a continuation of the collector wherein the base is formed by implantation. An emitter then is formed above the base, for example by deposition of an appropriately doped polycrystalline silicon layer and subsequent drive-out. The second layer of polycrystalline silicon then is doped and structured such that it forms a base terminal. The base terminal then is arranged self-aligned the base in this bipolar transistor.

It also is within the scope of the invention to connect the collector with a collector terminal arranged laterally from the emitter and base. To that end, it is advantageous to deposit the fourth layer surface-wide and conformally after the formation of the base terminal and before the surface of the substrate is exposed, this fourth layer having the same etching properties as the first layer. The fourth layer then is planarized, so that the surface of the second layer is exposed. A mask then is produced that defines a first region for the emitter, base and collector and defines a second region for a collector terminal laterally therefrom. In an anisotropic etching step that is selective vis-a-vis silicon, the surface of the second layer in the first region and the surface of the substrate in the second region can then be exposed. The second layer of polycrystalline silicon thereby acts as an etching stop in the first region and the surface of the substrate acts as an etching stop in the second region.

In an anisotropic etching step that is selective vis-a-vis $SiO_2$, the second layer can be removed in the first region and an etched trench into the surface of the substrate is produced in the second region. The depth of the etched trench is thereby controlled via the duration of the etching step. The first region and the second region are simultaneously formed upon employment of the same etching steps.

Although etching must be carried out more deeply into the substrate in the second region for the collector terminal, an additional process step for the formation of the second region is avoided by the layer sequence of the invention.

Before the formation of the undercuts or underetchings of the first layer, the exposed edges of all layers adjoining the first region and the second region are covered with the third layer of, for example, $SI_3N_4$.

It is within the scope of the invention to deposit an oxide layer surface-wide and conformally after the selective epitaxy and to deposit a first polycrystalline silicon layer surface-wide and conformally on this oxide layer. In an anisotropic etching step that is selective with respect to $SiO_2$, the first polycrystalline silicon layer can then be etched back such that side wall coverings or spacers arise at the vertical side walls of the first and of the second region. The exposed oxide layer then is wet-chemically removed selectively vis-a-vis silicon.

The spacers serve as insulators between the second layer forming the base terminal and the emitter terminal to be subsequently produced. Further, the active part of the single-crystal region is defined by the spacers. Potential voids and grain boundaries that could exist at the edge to the second layer thereby do not lie in the active part of the single-crystal region. A stressing of the surface of the single-crystal region in the anisotropic etching step is avoided by producing the spacers in two layers.

After the spacers have been formed and the silicon surface has been exposed in the first and second region, a second polycrystalline layer can be produced surface-wide and conformally with such a thickness that the first region and the second region are essentially filled up with it. In an anisotropic etching step, the second polycrystalline layer then is etched back to such an extent that the height of the part of the second polycrystalline layer remaining in the first region and in the second region essentially corresponds to the height of the base terminal. The second polycrystalline layer then is doped such that it acts as emitter terminal in the first region and acts as collector terminal in the second region. It can be appreciated that the manufacture of a planar bipolar transistor is possible in this way.

These and other features of the invention will become clearer in the detailed description of the presently preferred embodiments and the accompanying drawings.

DETAILED DESCRIPTION OF THE PRESENTLY PREFERRED EMBODIMENTS

As described above, the invention provides one or more methods by which a single crystal region can be provided which is laterally limited and which can be used as an active part of a transistor. Various methods for manufacturing such regions are described below with reference to the figures.

Figure 1:
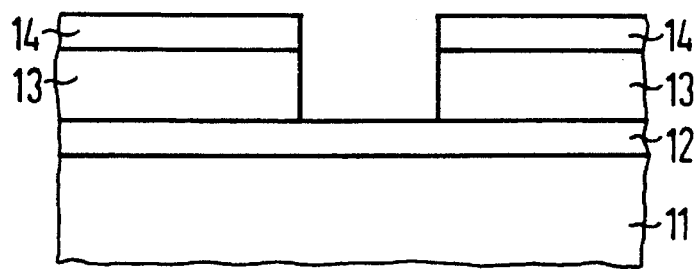
FIG. 1 through FIG. 3 illustrates steps for manufacturing a laterally limited, single-crystal region on a substrate.
Figure 2:
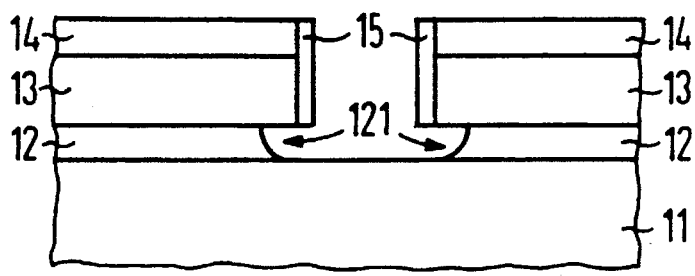
Figure 3:
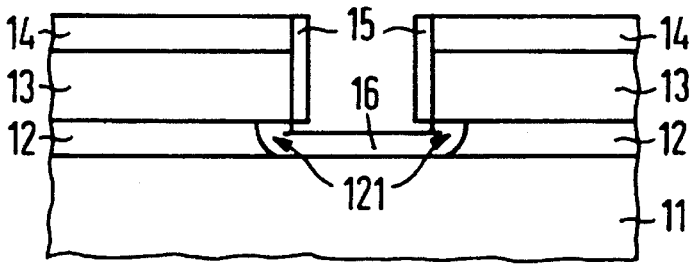

A first method is illustrated in FIGS. 1–3 wherein a single crystal region is formed on a substrate 11.

As illustrated, a first layer 12 of, for example, $SiO_2$ is thermally grown on the substrate 11 which is made of, for example, monocrystalline silicon. A second layer 13 of polycrystalline silicon then is deposited on the first layer 12. Subsequently, a mask of, for example, $Si_3N_4$ is produced on the second layer 13 so that the second layer 13 can be anisotropically etched to produce a hole, the first layer 12 thereby acting as an etching stop. By conformal deposition of a layer 14 made of, for example, $Si_3N_4$ and subsequent, anisotropic etching, spacers 15 are formed that cover the side walls of the hole in the second layer 13 exposed in the structuring of that layer.

As further illustrated in FIG. 2, an anisotropic etching of the first layer 12 follows the formation of the spacers 15. This etching ensues selectively with respect to the spacers 15, the second layer 13 and the substrate 11. For example, the etching is a wet-chemicall etching. As a result, undercuts or underetchings 121 of the first layer 12 are formed under the second layer 13. The depth of the underetchings 121 is determined by the duration of the isotropic etching process (see FIG. 2). In any event, as can be seen in FIG. 2, the surface of the substrate 11 is thereby uncovered.

As illustrated in FIG. 3, a single-crystal region 16 of, for example, silicon is produced or otherwise generated on the uncovered surface of the substrate 11 by means of selective epitaxy. Facettes or side wall effects of the single-crystal region 16 will occur in the region of the undercuts or underetchings 121. However, since the silicon also grows at those surfaces of the second layer 13 of polycrystalline silicon facing toward the undercuts or underetchings 121, the undercuts or underetchings 121 become completely filled up.

It can be appreciated that crystal faults lying in the region of the undercuts or underetchings 12 are not detrimental to the use of the single-crystal region since they occur under the second layer 13 (see FIG. 3).

Figure 4:
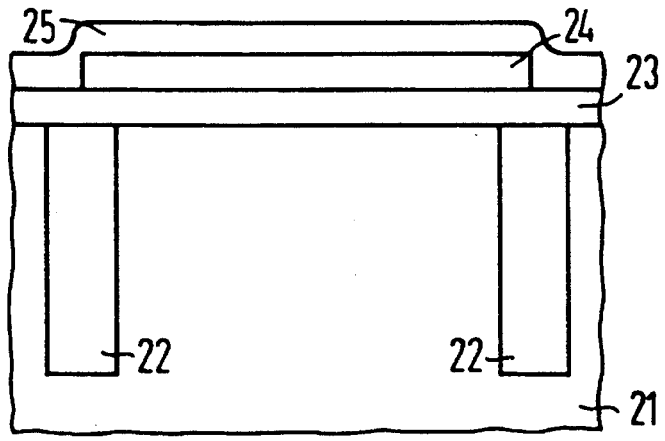
FIGS. 4 through 9 illustrate steps for manufacturing a MOS transistor.
Figure 5:
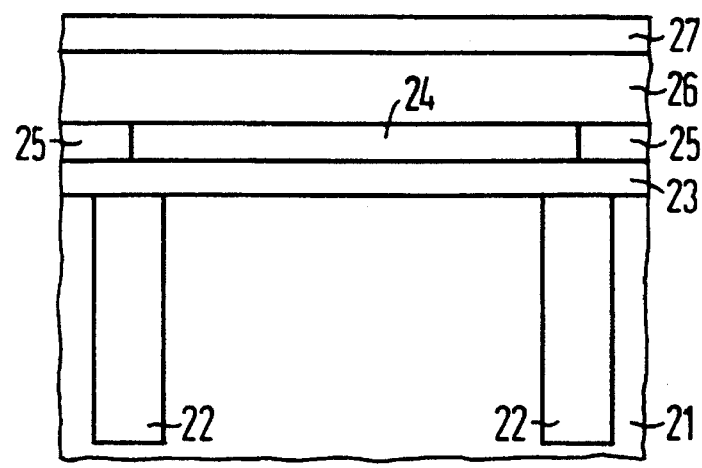

In FIGS. 4–9, it is illustrated how a MOS transistor can be manufactured in accordance with the invention. In FIG. 4 it is illustrated how trenches 22 filled with insulating material can be produced in a substrate 21. The trenches 22 can be formed in the way described by H. Goto, Springer Series in *Electronics and Photonics*, Vol. 27, pages 61–77. For example, if the substrate 21 is composed of single-crystal silicon, a first layer 23 of $SiO_2$ can then be thermally grown on the surface of the substrate 21. A second layer 24 of, for example, p-doped polysilicon then can be deposited on the first layer 23. Subsequently, a $SiO_2$ layer 25 can be deposited surface-wide and conformally, for example by decomposition of TEOS. The $SiO_2$ layer 25 then is removed to such an extent with a globally planarizing method such as, for example, re-grinding or re-etching via epoxy resins, that the surface of the structured, second layer 24 is uncovered, as illustrated in FIG. 5. As a result, a $SiO_2$ layer 26 is produced at the surface of the second layer 24 and of the $SiO_2$ layer 25 and a $Si_3N_4$ layer 27 is produced on this layer 26.

Figure 6:
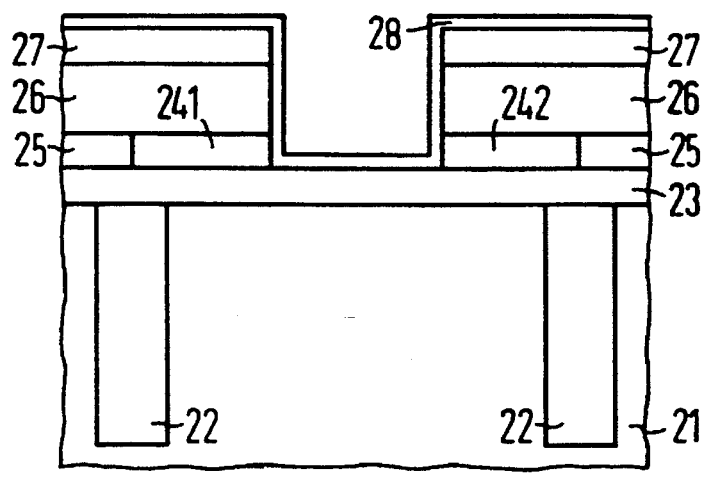

After a photolithographic definition step (not shown), the $Si_3N_4$ layer 27 and the $SiO_2$ layer 26 then are structured by anisotropic etching, as illustrated in FIG. 6, to provide a hole therethrough. The second layer 24 of polycrystalline silicon thereby acts as an etching stop. The second layer 24 then also is structured in an anisotropic silicon etching to increase the depth of the hole through the layer 24 to produce a source region 241 and a drain region 242. Subsequently, a $Si_3N_4$ layer 28 is conformally deposited surface-wide, including the hole.

Figure 7:
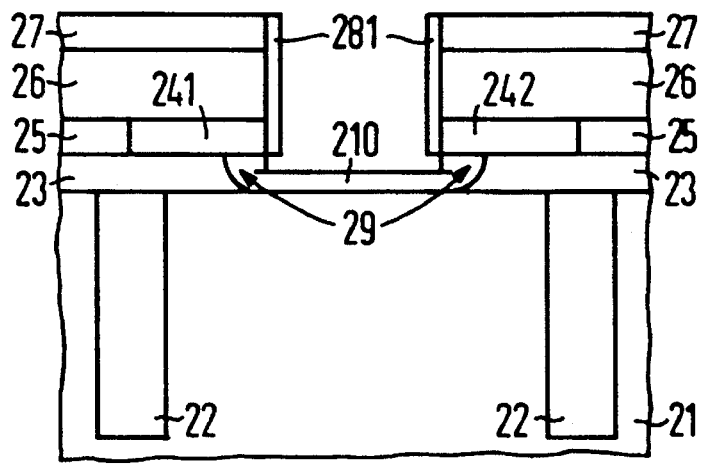

Thereafter, in an anisotropic etching step wherein the first layer 23 serves as an etching stop, vertical spacers 281 are produced at the vertical side walls of the $Si_3N_4$ layer 27, the $SiO_2$ layer 26 and the second layer 24 of polycrystalline silicon. This is illustrated in FIG. 7.

The first layer 23 then is removed in an isotropic etching step, for example wet-chemically, until the surface of the substrate 21 is uncovered. The etching ensues selectively with respect to the substrate 21. In accordance with the duration of the etching, undercuts or underetchings 29 under the source region 241 and under the drain region 242 are generated. Then a channel region 210 is grown on the uncovered surface of the substrate 21 with selective epitaxy. The channel region 210 is formed, for example, of p-doped silicon and it grows both at the surface of the substrate 21 as well as at the uncovered surfaces of source and drain regions 241 and 242, respectively.

It can be appreciated that facettes and side wall effects will lie within the uncercuts or underetchings 29. Moreover, a higher doping due to drive-out from source and drain region 241 and 242 arises in this region. These crystal defects therefore are not harmful to the functioning of the resulting MOS transistor.

Figure 8:
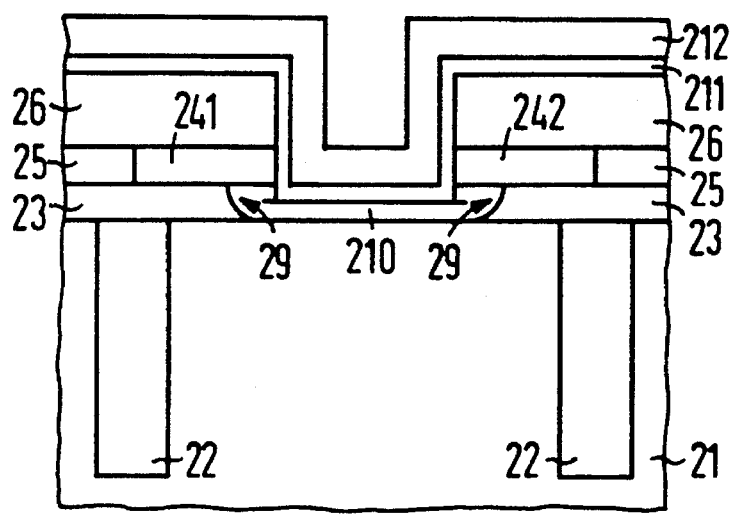
Figure 9:
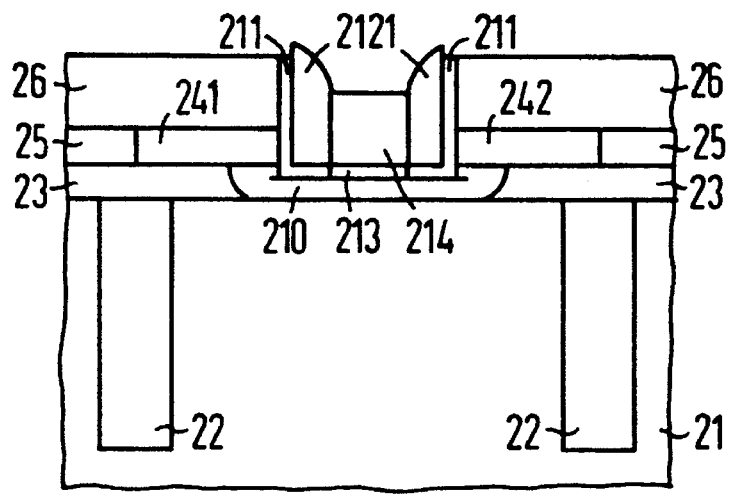

The vertical spacers 281, and the layer 27, then are removed, for example by wet-chemical etching selectively with respect to $SiO_2$ and silicon. After removal of the spacers 281 and of the $Si_3N_4$ layer 27, an $SiO_2$ layer 211 is deposited surface-wide and conformally and a polycrystalline silicon layer 212 is deposited thereon, likewise surface-wide and conformally, as illustrated in FIG. 8. However, the upper surface portion of the polycrystalline silicon layer 212 (i.e., not that portion covering the sidewalls of the hole) then is etched back in an anisotropic etching step. Spacers 2121 are thereby formed from the polycrystalline silicon layer 212, as illustrated in FIG. 9. Subsequently, the uncovered parts of the $SiO_2$ layer 211 (i.e., that portion not located on the sidewalls of the hole) are removed selectively with respect to silicon, for example wet-chemically, as also illustrated in FIG. 9. The surface of the channel region 210 (i.e., the bottom of the hole) thereby is uncovered.

In the result of this manufacture of the spacers 2121 as compared to the manufacture of spacers of oxide, an aftertreatment for removing polymers at the surface of silicon is made superfluous. The silicon attack during this polymer removal on the single-crystal channel region 210 is thus avoided, this leading to a noticeable enhancement of the process stability.

As illustrated in FIG. 9, a gate dielectric 213 subsequently is produced at the uncovered surface of the channel region 210, for example by thermal oxidation. Subsequently, a gate electrode 214 of, for example, doped polysilicon is formed above and on the gate dielectric 213.

The result of the foregoing is a planar MOS transistor with a gate electrode 214 that completely fills out the interspace between the spacers 2121. The MOS transistor, finally, is finished by forming contact holes to source and drain regions 241 and 242 and by appropriate metallization thereof in a known way (not shown).

This MOS transistor realized according to the manufacturing method of the invention has the advantage of being self-aligned or self-registering with respect to source/drain and gate. Since the channel region is deposited, the possibilities of using Delta-doped profiles or hetero-junction profiles upon employment of SiGe open up.

In FIGS. 10 to 21 there is illustrated a method of forming a bipolar transistor employing principles of the invention.

Figure 10:
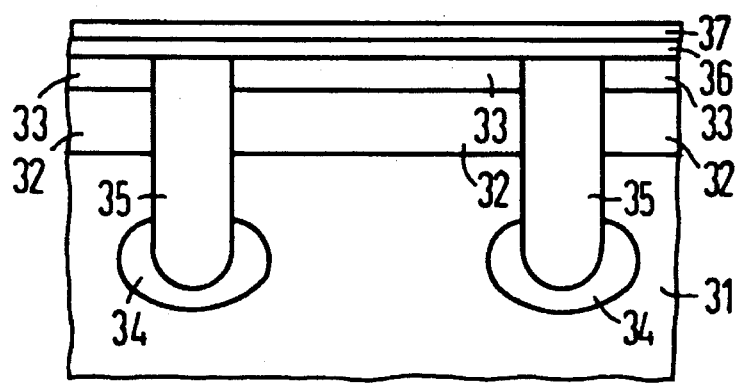
FIGS. 10 through 21 illustrate steps for manufacturing a bipolar transistor.

As illustrated in FIG. 10, a highly $n^+$-doped, buried layer 32 of single-crystal silicon preferably is produced on a substrate 31 of p-doped, monocrystalline silicon. A lightly n-doped layer 33 of single-crystal silicon then is applied onto the buried layer 32. Channel stopper regions 34 and trenches 35 filled with insulation material then are formed in the substrate 31 according to the technique described in H.

Goto, Springer Series in *Electronics and Photonics*, Vol. 27, pages 61–77. The trenches 35 divide the n-doped layer 33 and the buried layer 32 and, in common with the channel-stopper regions 34, provide a reliable, lateral insulation of neighboring transistors in the substrate.

As also illustrated in FIG. 10, an oxide layer 36 then is thermally grown as a first layer at the surface of the n-doped layer 33 and of the filled trenches 35. A polycrystalline silicon layer 37 then is deposited on the oxide layer 36 as a second layer. The polycrystalline silicon layer 37 is subsequently p-doped, for example with boron.

Figure 11:
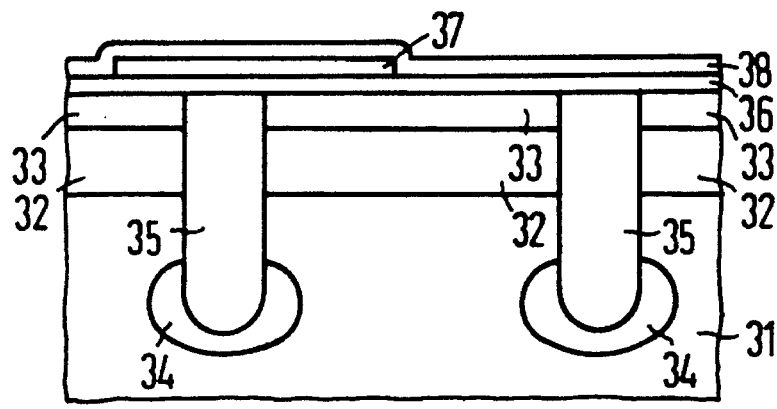
Figure 12:
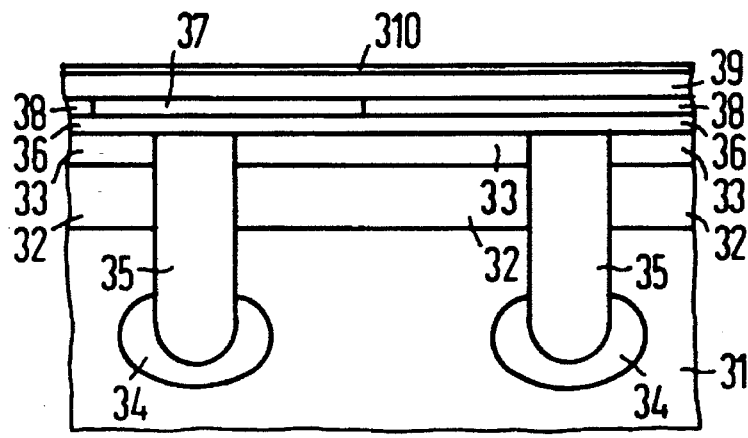

The polycrystalline silicon layer 37 subsequently is structured as illustrated in FIG. 11. A $SiO_2$ layer 38 then is conformally deposited thereon. That portion of the $SiO_2$ layer 38 lying over the layer 37 is removed with a globally planarizing method such as, for example, re-grinding or re-etching via epoxy resin over the surface of the polycrystalline silicon layer 37 (see FIG. 12). The polycrystalline silicon layer 37 and the remainder of the $SiO_2$ layer 38 then form a common, planar surface. An $SiO_2$ layer 39 then is deposited thereon and a $Si_3N_4$ layer 310 is deposited on this layer 39 (see FIG. 12).

Figure 13:
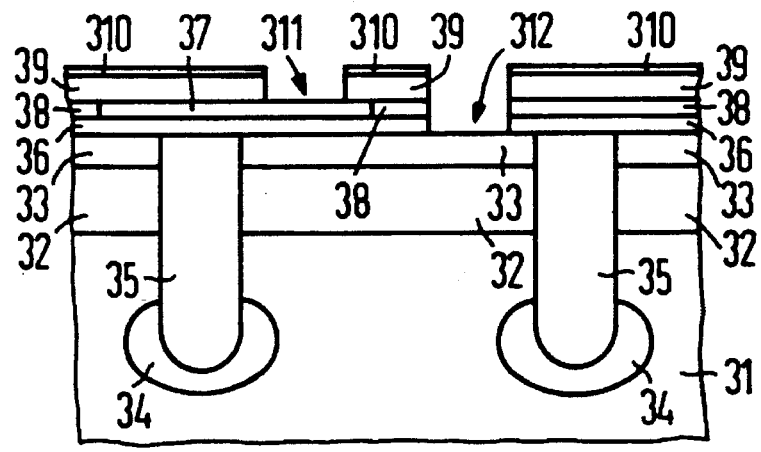

Following a phototechnique (not shown), the $Si_3N_4$ layer 310 is structured (i.e., etched) as illustrated in FIG. 13 by anisotropic etching. A first region 311 and a second region 312 thereby are defined. Both the first region 311 as well as the second region 312 lie within the trenches 35. The first region 311 lies completely above the polycrystalline silicon layer 37. The second region 312 lies completely next to the polycrystalline silicon layer 37. By anisotropic etching that attacks $SiO_2$ and is selective with respect to silicon, the first region 311 is etched into the $SiO_2$ layer 39 and the second region 312 is etched into the $SiO_2$ layer 39, the $SiO_2$ layer 38 and the $SiO_2$ layer 36. The surface of the polycrystalline silicon layer 37 is thereby uncovered in the first region 311. In the second region 312, the surface of the n-doped layer 33 that is composed of mono-crystalline silicon is uncovered (see FIG. 13). Since the etching ensues selectively with respect to silicon, the polycrystalline silicon layer 37 and the n-doped silicon layer 33 act as etching stops.

Figure 14:
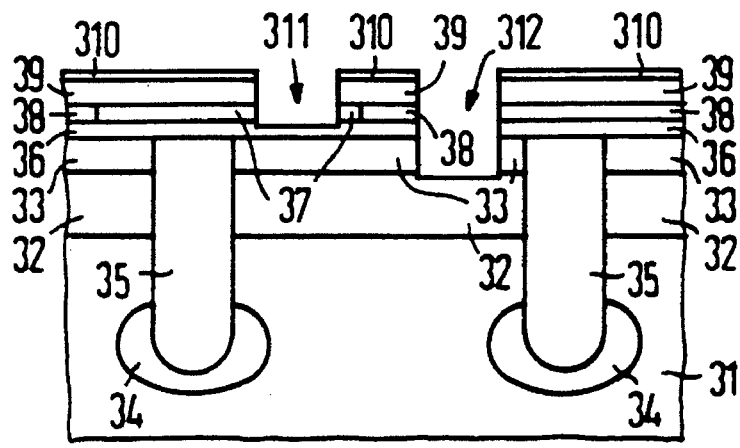

The polycrystalline silicon layer 37 is then structured in an anisotropic silicon etching, as illustrated in FIG. 14, the oxide layer 36 lying therebelow acting as an etching stop. The n-doped layer 33 then is etched in the second region 312. As a result, an etched trench at whose floor the surface of the buried layer 32 is uncovered arises. The depth of the etched trench is set via the duration of the anisotropic silicon etching (see FIG. 14).

Figure 15:
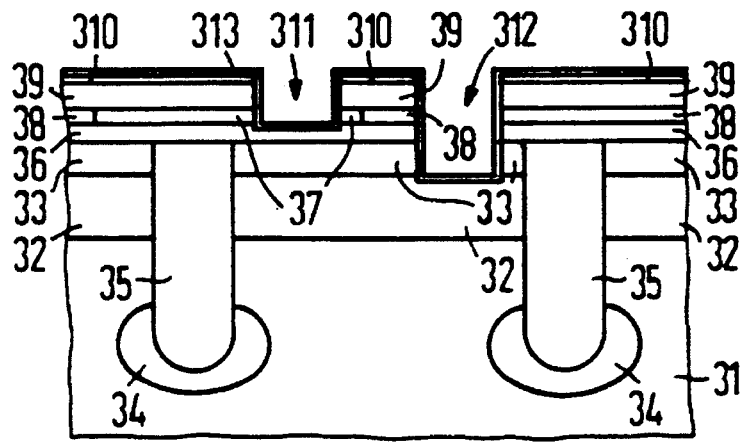

A $Si_3N_4$ layer 313 subsequently is conformally deposited surface-wide, as illustrated in FIG. 15.

Figure 16:
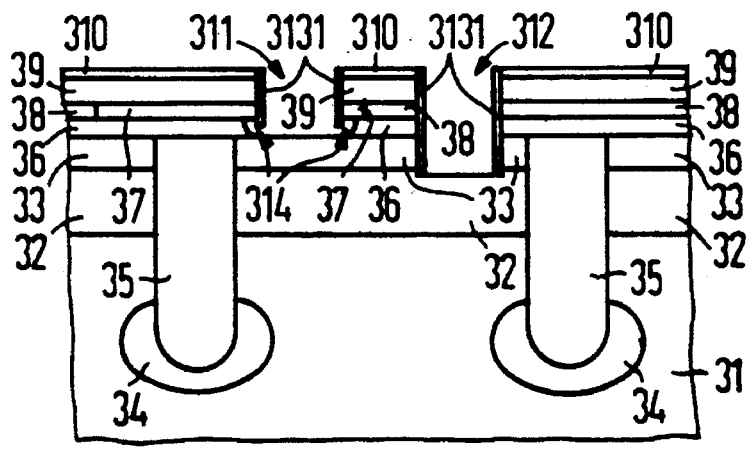

As illustrated in FIG. 16, the $SI_3N_4$ layer 313 is etched back by anisotropic etching that is selective with respect to silicon and $SiO_2$, so that vertical spacers 3131 arise therefrom at the uncovered, vertical side walls of the $Si_3N_4$ layer 310, of the $SiO_2$ layer 39, of the polycrystalline silicon layer 37, of the oxide layer 36 and of the n-doped layer 33. The oxide layer 37 in the first region 311 then is removed in an isotropic etching step that is selective with respect to silicon and $Si_3N_4$. The surface of the n-doped layer 33 thereby is uncovered. Simultaneously, undercuts or underetchings 314 under the polycrystalline silicon layer 37 are produced. Of course, the depth of the underetchings 314 is set via the etching duration. Moreover, this etching produces no changes whatsoever in the second region 312 since it does not attack silicon and $Si_3N_4$.

Figure 17:
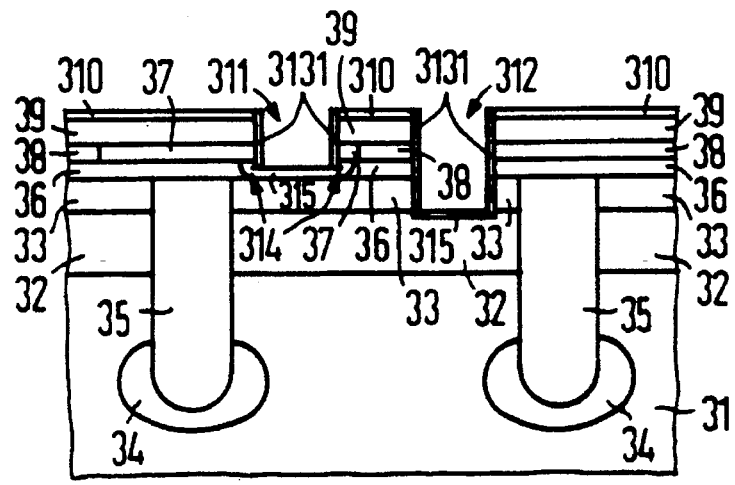

As illustrated in FIG. 17, respective single-crystal regions 315 are produced by selective epitaxy at the uncovered surface of the n-doped layer 33 in the first region 311 and at the uncovered surface of the buried layer 32 in the second region 312. In the first region 311, the single-crystal region 315 also grows at the exposed surfaces of the polycrystalline 37 in the region of the undercuts or underetchings 314.

The single-crystal region 315 in the first region 311 forms a base for the eventual bipolar transistor. The single-crystal region 315 is therefore grown, for example, p-doped with a dopant concentration of approximately $1 \times 10^{18}$ $cm^{-3}$. The layer thickness in this case lies in the range between 50 and 100 nm.

Another possibility is posed by realizing the single-crystal region 314 boron/germanium-doped. The germanium part in the silicon thereby lies at approximately 20 through 40 atom percent. In this case, a hetero structure base is formed.

A further possibility is posed by growing the single-crystal region 315 lightly n-doped with a dopant concentration of approximately $1 \times 10^{16}$ $cm^3$ As. The single-crystal region 315 then represents a continuation of a collector formed by the n-doped layer 33. In this case, the base is introduced by subsequent, unmasked implantation of boron.

The $Si_3N_4$ layer 310 and the spacers 3131 that served as etching protection for the layers lying therebelow during the laterally acting isotropic $SiO_2$ etching (see FIG.17) can remain on the structure or can be removed. The first possibility has the advantage of eliminating process steps, whereby the latter possibility has the advantage that distortions due to the $Si_3N_4$ are avoided.

Figure 18:
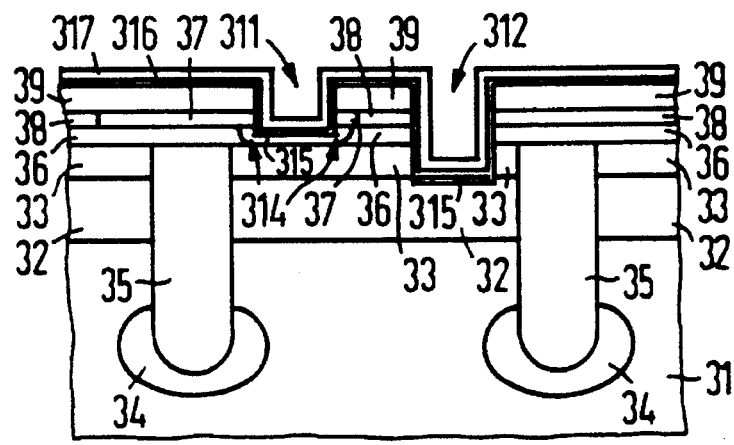

In FIG. 18, the layer 310 and spacers 3131 are shown removed.

After the removal of the $Si_3N_4$ layer 310 and of the spacer 3131 (see FIG. 18), an oxide layer 316 is deposited surface-wide and conformally in a thickness of, for example, 50 nm and a polycrystalline silicon layer 317 is deposited thereon surface-wide and conformally.

Figure 19:
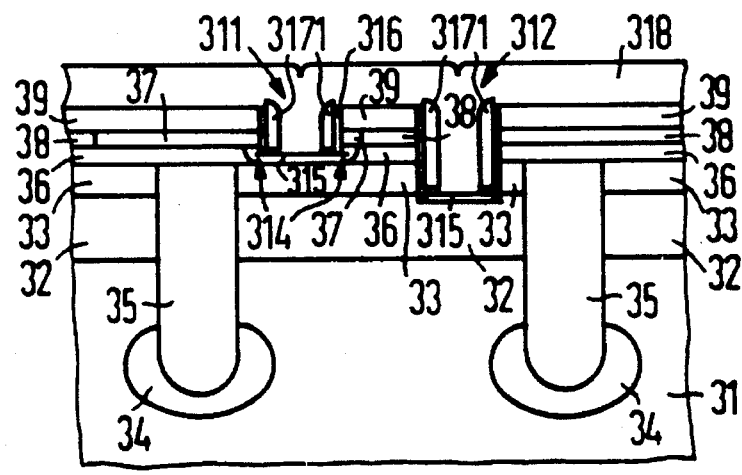

The polycrystalline silicon layer 317 subsequently is anisotropically etched selectively with respect to silicon oxide, to form spacers 3171 as illustrated in FIG. 19. The oxide layer 16 thereby acts as etching stop. The uncovered parts of the oxide layer 316 are subsequently wet-chemically removed selectively with respect to silicon.

The manufacture of the spacers 3171 in this way by deposition of, first, an oxide layer and, then, a polycrystalline silicon layer has the advantage compared to the production of a pure oxide spacer that no after-treatment for the removal of the polymers that arise in the realization of an oxide spacer by $SiO_2$ dry-etchings on a silicon foundation is necessary. The silicon attack during this polymer removal is thus avoided, this always occurring at the surface of the single-crystal region. This leads to a noticeable enhancement of the process stability. In particular, fluctuations in the thickness of the single-crystal region 315 are avoided. This is especially important in the manufacture of shallow emitter/base dopant profiles in order to suppress fluctuations in the current amplification or gain of the finished bipolar transistor.

As further illustrated in FIG. 19, the foregoing is followed by a conformal deposition of a polycrystalline silicon layer 318. The polycrystalline silicon layer 318 is deposited in such a thickness that the interspaces between the oppositely situated spacers 3171 in both the first region 311 as well as in the second region 312 are completely filled up. The polycrystalline silicon layer 318 is $n^+$-doped. For example, this ensues by arsenic implantation or with an arsenic-doped deposition.

Figure 20:
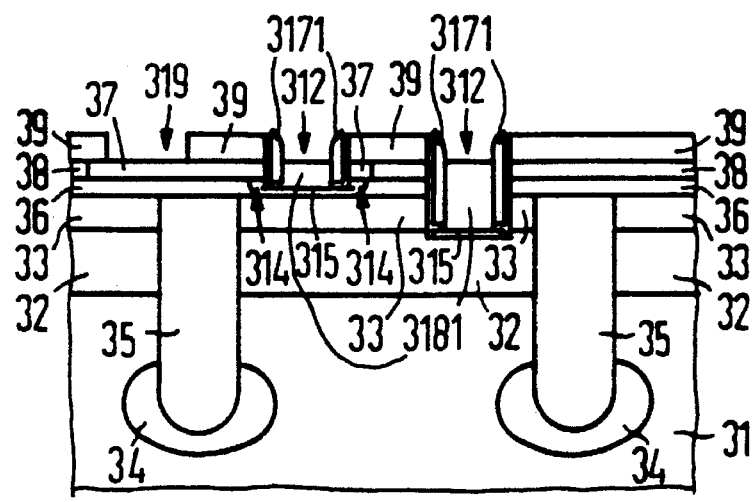

As illustrated in FIG. 20, the polycrystalline silicon layer 318 is etched back selectively with respect to silicon oxide in an anisotropic etching step such that the height of the upper edge of the remaining polysilicon 3181 in the first region 311 and in the second region 312 approximately corresponds to the height of the upper edge of the polycrystalline layer 317. The remaining polysilicon 3181 in the first region 311 forms an emitter terminal from which the emitter is formed by drive-out. The remaining polycrystalline silicon 3181 in the second region 312 forms a collector terminal that is connected via the buried layer 32 (that acts as buried collector terminal) to the n-doped layer 33 that acts as collector. The polycrystalline layer 37 forms the base terminal that, in the region of the undercuts or underetchings 314, is connected to that single-crystal zone 315 in the first region 311 that forms the base. The side wall defects and facettes of the single-crystal region 315 lie in the region of the undercuts or underetchings 314 and, since a high doping is achieved in this region by drive-out from the base terminal 37, these crystal faults are not harmful to the finished bipolar transistor.

After a photolithographic definition (not shown), a base contact window 319 is opened by anisotropic etching into the $SiO_2$ layer 39. This base contact window 319 extending through the $SiO_2$ layer 39 onto the polycrystalline silicon layer 37 that forms the base terminal.

Figure 21:
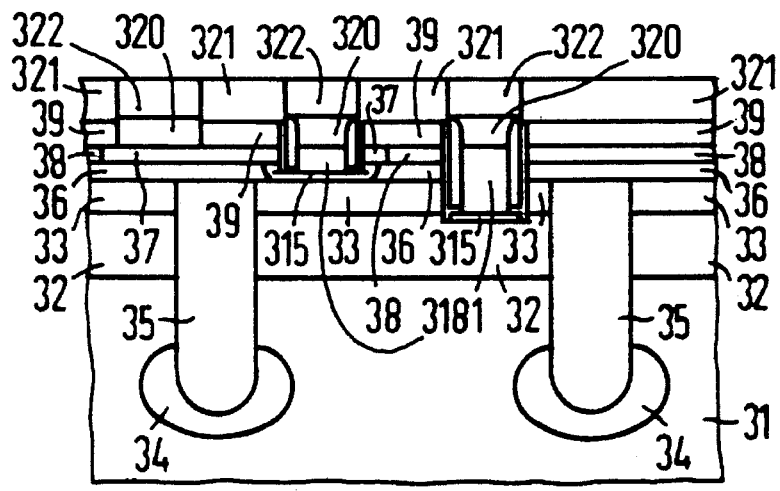

Subsequently, as illustrated in FIG. 21, the base contact window 319, the first region 311 and the second region 312 are filled with tungsten 320. For example, this ensues by selective deposition or by conformal deposition with following anisotropic etching. A complete planarity of the bipolar transistor is thereby produced (see FIG. 21).

The structure is subsequently provided with a passivation layer 321. Contact holes are opened in the passivation layer 321 in a known way and are provided with metallizations 322 for the connection of the polycrystalline silicon layer 37 serving as base terminal, of the polycrystalline silicon 3181 acting as the emitter terminal and of the polycrystalline silicon 3181 acting as the collector terminal. An aluminum composition having the composition standard for contacts, for example AlSiTi or AlSiCu, is sputtered and structured as the metallization 322.

The bipolar transistor that derives from the foregoing is realized with only five phototechniques, and the first metallization level is also included therein. The bipolar transistor has a self-alignment both with respect to emitter/base as well as with respect to base/collector. The area that the base-collector capacitance defines is identical to that area that defines the current flow through the collector. This geometry represents the optimum at which a minimum base-collector capacitance is achieved. The collector contact of the bipolar transistor ensues via a trench contact, this having the advantage that the connection of the buried layer 32 that serves as the buried collector terminal ensues without significant temperature stress on the structure. The bipolar transistor has extremely high packing densities.

While preferred embodiments have been shown, modifications and changes may become apparent to those skilled in the art which shall fall within the spirit and scope of the invention. It is intended that such modifications and changes be covered by the attached claims.

We claim:

1. A method for manufacturing a MOS transistor comprising the steps of:
    a) providing a substrate made of a single crystal material;
    b) forming a first layer on a surface of the substrate, said first layer being selectively etchable with respect to the substrate;
    c) forming a second layer on the first layer, the second layer being selectively etchable with respect to the first layer;
    d) providing an opening in the first and second layers so as to expose an area on the surface of the substrate;
    e) selectively etching the first layer with respect to the substrate and the second layer so as to provide an undercut between the second layer and the surface of the substrate;
    f) forming a single crystal region on the exposed surface of the substrate by selective epitaxy;
    g) doping the second layer such that parts of the second layer adjoining the single-crystal region acting as a channel region form a source region and a drain region;
    h) producing a gate dielectric at a surface of the single-crystal region; and
    i) forming a gate electrode that is insulated from the source and drain regions on the gate dielectric.

2. The method of claim 1, wherein the substrate is made of single crystal silicon.

3. The method of claim 1, wherein the single crystal region comprises $Si_{1-x}Ge_x$, with $0.2 \leq x \leq 0.4$.

4. The method of claim 1, wherein the first layer comprises $SiO_2$ and the second layer comprises polycrystalline silicon, and the method comprises the further step of covering the second layer with a third layer that resists etchings of the first layer, and no nucleation occurring in the third layer during the selective epitaxy step.

5. The method of claim 4, wherein the third layer comprises $Si_3N_4$.

6. The method of claim 4, comprising the step of completely removing the third layer after the selective epitaxy step.

7. The method of claim 4, wherein the single-crystal region is provided with a dopant profile that is composed at least of a first and of a second part, the first part adjoins a source and drain region and is doped with the same conductivity type as the source and drain region, and the second part is arranged under the first part and is doped with a conductivity type opposite that of the source and drain region.

* * * * *